(12) United States Patent
Hagimoto et al.

(10) Patent No.: US 11,705,330 B2
(45) Date of Patent: Jul. 18, 2023

(54) SUBSTRATE FOR ELECTRONIC DEVICE AND METHOD FOR PRODUCING THE SAME

(71) Applicant: SHIN-ETSU HANDOTAI CO., LTD., Tokyo (JP)

(72) Inventors: Kazunori Hagimoto, Takasaki (JP); Shouzaburo Goto, Chiyoda-ku (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 45 days.

(21) Appl. No.: 17/617,091

(22) PCT Filed: Apr. 30, 2020

(86) PCT No.: PCT/JP2020/018262
§ 371 (c)(1),
(2) Date: Dec. 7, 2021

(87) PCT Pub. No.: WO2021/005872
PCT Pub. Date: Jan. 14, 2021

(65) Prior Publication Data
US 2022/0238326 A1 Jul. 28, 2022

(30) Foreign Application Priority Data

Jul. 11, 2019 (JP) .................................. 2019-129089

(51) Int. Cl.
*H01L 21/02* (2006.01)
*H01L 29/26* (2006.01)

(52) U.S. Cl.
CPC .... *H01L 21/0254* (2013.01); *H01L 21/02381* (2013.01); *H01L 21/02488* (2013.01); *H01L 29/26* (2013.01)

(58) Field of Classification Search
None
See application file for complete search history.

(56) References Cited

U.S. PATENT DOCUMENTS

2012/0153440 A1    6/2012  Ikuta et al.
2015/0357451 A1   12/2015  Manippady et al.
(Continued)

FOREIGN PATENT DOCUMENTS

JP    2007-246289 A    9/2007
JP    2010-225947 A   10/2010
(Continued)

OTHER PUBLICATIONS

Jul. 21, 2020 International Search Report issued in International Patent Application No. PCT/JP2020/018262.
(Continued)

*Primary Examiner* — Jack S Chen
(74) *Attorney, Agent, or Firm* — Oliff PLC

(57) ABSTRACT

A substrate for an electronic device, including a nitride semiconductor film formed on a joined substrate including a silicon single crystal, where the joined substrate has a plurality of silicon single crystal substrates that are joined and has a thickness of more than 2000 μm, and the plurality of silicon single crystal substrates are produced by a CZ method and have a resistivity of 0.1 Ωcm or lower. This provides: a substrate for an electronic device having a nitride semiconductor film formed on a silicon substrate, where the substrate for an electronic device can suppress a warp and can also be used for a product with a high breakdown voltage; and a method for producing the same.

8 Claims, 1 Drawing Sheet

(a)

(b)

(56) References Cited

U.S. PATENT DOCUMENTS

2022/0238326 A1\* 7/2022 Hagimoto ............... H01L 29/26
2022/0367188 A1\* 11/2022 Hagimoto ......... H01L 21/02389

FOREIGN PATENT DOCUMENTS

| JP | 2011-103380 A | 5/2011 |
| JP | 2014-192226 A | 10/2014 |
| JP | 2018-041851 A | 3/2018 |
| WO | 2011/016219 A1 | 2/2011 |

OTHER PUBLICATIONS

Jan. 11, 2022 International Preliminary Report on Patentability issued in International Patent Application No. PCT/JP2020/018262.
Nov. 1, 2022 Office Action issued in Japanese Patent Application No. 2019-129089.
Jun. 21, 2022 Office Action issued in Japanese Patent Application No. 2019-129089.

\* cited by examiner

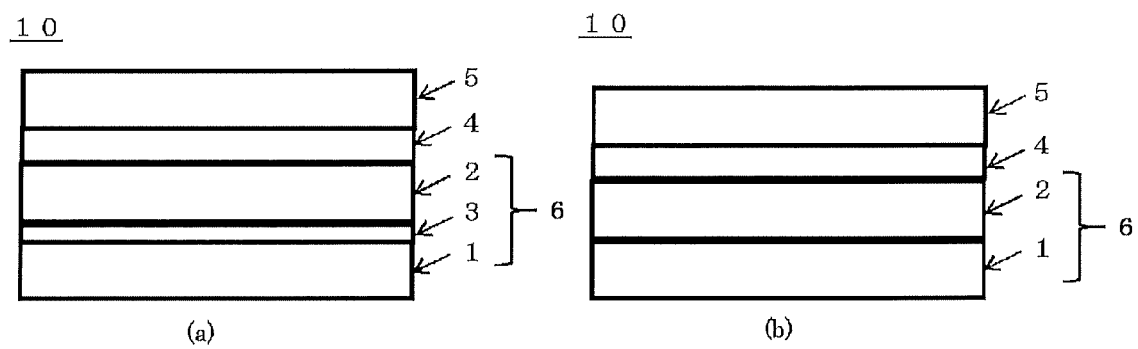

SUBSTRATE FOR ELECTRONIC DEVICE AND METHOD FOR PRODUCING THE SAME

TECHNICAL FIELD

The present invention relates to: a substrate for an electronic device; and a method for producing the same.

BACKGROUND ART

Nitride semiconductors, including GaN and AlN, can be used for fabricating high electron mobility transistors (HEMT) and electronic devices with a high breakdown voltage that use two-dimensional electron gas.

It is difficult to produce a nitride wafer having a nitride semiconductor grown on a substrate, and a sapphire substrate or a SiC substrate is used as the substrate. However, for a larger diameter and cost reduction for a substrate, epitaxial growth by vapor deposition on a silicon substrate is employed. When an epitaxially grown film is fabricated by vapor deposition on a silicon substrate, a substrate with a larger diameter can be used compared to when a sapphire substrate or a SiC substrate is used, so that the productivity of devices is high, and there are advantages regarding heat dissipation properties. However, due to stress caused by a difference in lattice constant or a difference in thermal expansion coefficient, an increase in warp and plastic deformation easily occur. Therefore, the reduction of stress is carried out through growth conditions and a relief layer.

In electronic devices with a high breakdown voltage, it is necessary to stack an epitaxial layer thickly in order to enhance the high breakdown voltage characteristics. If an epitaxial layer is thus stacked thickly, a warp occurs in the wafer due to the difference between a silicon substrate, which is the substrate, and the epitaxial layer in thermal expansion coefficient.

Patent Document 1 discloses an epitaxial substrate for an electronic device, and in the epitaxial substrate, an epitaxial layer AlN/Si (1000 Ωcm or higher)/Si (100 Ωcm or lower) is formed to join a high resistance substrate to a low resistance substrate in order to control a warp shape. Meanwhile, Patent Document 2 discloses an epitaxial substrate for an electronic device, and in the epitaxial substrate, an epitaxial layer AlN/Si (CZ, low resistance)/Si (FZ, high resistance) is formed to join a low resistance CZ substrate to a high resistance FZ substrate in order to suppress a warp.

However, in substrates for electronic devices used in electronic devices with a high breakdown voltage, it has been desired to suppress the warp of a wafer further when an epitaxial layer is thickly stacked.

CITATION LIST

Patent Literature

Patent Document 1: WO 2011/016219
Patent Document 2: JP 2014-192226 A

SUMMARY OF INVENTION

Technical Problem

The present invention has been made to solve the above-described problem, and an object thereof is to provide: a substrate for an electronic device having a nitride semiconductor film formed on a silicon substrate, where the substrate for an electronic device can suppress a warp and can also be used for a product with a high breakdown voltage; and a method for producing the same.

Solution to Problem

To achieve the object, the present invention provides a substrate for an electronic device, comprising a nitride semiconductor film formed on a joined substrate comprising a silicon single crystal, wherein the joined substrate has a plurality of silicon single crystal substrates that are joined and has a thickness of more than 2000 μm, and the plurality of silicon single crystal substrates are produced by a CZ method and have a resistivity of 0.1 Ωcm or lower.

In the inventive substrate for an electronic device, the plurality of silicon single crystal substrates are produced by a CZ method and have a resistivity of 0.1 Ωcm or lower, and furthermore, the joined substrate has a thickness of more than 2000 μm, so that the strength of the joined substrate is greatly increased. Therefore, it is possible to suppress warps in the substrate for an electronic device due to the formed nitride semiconductor film. Accordingly, in particular, the inventive substrate for an electronic device is optimum as a substrate for an electronic device used for a product with a high breakdown voltage.

In this event, the plurality of silicon single crystal substrates preferably have an oxygen concentration of $3.0 \times 10^{17}$ to $1 \times 10^{18}$ atoms/cm$^3$ (ASTM'79).

In such silicon single crystal substrates, slips can be prevented from occurring.

Furthermore, the joined substrate preferably has a plurality of CZ silicon single crystal substrates joined via a SiO$_2$ film.

In such a joined substrate, stress caused by the nitride semiconductor film can be relieved, and a thicker nitride semiconductor film can be formed.

In addition, the present invention provides a method for producing a substrate for an electronic device by forming a nitride semiconductor film on a joined substrate comprising a silicon single crystal, the method comprising the steps of:

obtaining a joined substrate having a thickness of more than 2000 μm by joining a plurality of silicon single crystal substrates; and forming a nitride semiconductor film on the joined substrate by epitaxial growth, wherein the plurality of silicon single crystal substrates are produced by a CZ method and have a resistivity of 0.1 Ωcm or lower.

According to the inventive method for producing a substrate for an electronic device, a plurality of CZ silicon single crystal substrates having a resistivity of 0.1 Ωcm or lower are used, and furthermore, the joined substrate has a thickness of more than 2000 μm, so that a strong joined substrate can be fabricated. Therefore, it is possible to suppress warps in the substrate for an electronic device when the nitride semiconductor film is formed. Accordingly, in particular, the inventive method is optimum as a method for producing a substrate for an electronic device used for a product with a high breakdown voltage.

Furthermore, the plurality of silicon single crystal substrates preferably have an oxygen concentration of $3.0 \times 10^{17}$ to $1 \times 10^{18}$ atoms/cm$^3$ (ASTM'79).

In such silicon single crystal substrates, slips can be prevented from occurring.

Furthermore, a plurality of CZ silicon single crystal substrates are preferably joined via a $SiO_2$ film in the step of obtaining a joined substrate.

In this manner, stress applied during growth of the nitride can be relieved, and the nitride semiconductor film can be formed more thickly.

Advantageous Effects of Invention

According to the inventive substrate for an electronic device and method for producing the same, the plurality of silicon single crystal substrates are produced by a CZ method and have a resistivity of 0.1 Ωcm or lower, and furthermore, the joined substrate has a thickness of more than 2000 μm, so that the strength of the joined substrate is greatly increased. Therefore, it is possible to suppress warps in the substrate for an electronic device caused by the formed nitride semiconductor film. Accordingly, in particular, the inventive substrate and method are optimum for a substrate for an electronic device used for a product with a high breakdown voltage.

BRIEF DESCRIPTION OF DRAWINGS

FIG. 1 is a conceptual diagram showing the inventive substrate for an electronic device in cases where (a) an adhesive layer is included between a plurality of silicon single crystal substrates and (b) an adhesive layer is not included.

DESCRIPTION OF EMBODIMENTS

Hereinafter, the present invention will be described in detail, but the present invention is not limited thereto.

The present inventors have earnestly studied a substrate for an electronic device and a method for producing the same, such that warps generated by the difference in thermal expansion coefficient have been suppressed regarding substrates for an electronic device produced by epitaxially growing a nitride semiconductor on a silicon substrate. The present inventors have thus found out that warps are remarkably suppressed by the use of a substrate that is obtained by joining a plurality of CZ silicon single crystal substrates with a low resistivity and that has a thickness of more than 2000 μm, and completed the present invention.

[Substrate for Electronic Device]

That is, the present invention is a substrate for an electronic device, including a nitride semiconductor film formed on a joined substrate including a silicon single crystal, where the joined substrate has a plurality of silicon single crystal substrates that are joined and has a thickness of more than 2000 μm, and the plurality of silicon single crystal substrates are produced by a CZ method and have a resistivity of 0.1 Ωcm or lower.

The inventive substrate for an electronic device has a nitride semiconductor film formed on a joined substrate including a silicon single crystal. In addition, in the present invention, the joined substrate is obtained by joining a plurality of silicon single crystal substrates produced by a CZ method.

FIG. 1 shows conceptual diagrams of the inventive substrate for an electronic device.

As shown in FIGS. 1 (a) and (b), the inventive substrate for an electronic device 10 includes: a joined substrate 6 obtained by joining a silicon single crystal substrate 1 and a silicon single crystal substrate 2 (a plurality of silicon single crystal substrates); and a nitride semiconductor film (device layer) 5 including a nitride. The form of joining the plurality of silicon single crystal substrates is not particularly limited, and an adhesive layer can be provided. FIG. 1 (a) shows a structure in which an adhesive layer 3 is included between the silicon single crystal substrate 1 and the silicon single crystal substrate 2. The adhesive layer is not particularly limited, but can be, for example, an oxide film ($SiO_2$). Meanwhile, FIG. 1 (b) shows a structure in which there is no adhesive layer 3 between the silicon single crystal substrate 1 and the silicon single crystal substrate 2. For example, the oxide film before the joining can be thinned, so that only the oxygen in the oxide film is diffused by a bonding heat treatment after the joining. Thus, it is possible to achieve a structure having no oxide film in the joining interface. When the adhesion of the silicon single crystal substrates is achieved with an oxide film in this manner, the stress applied during the growth of the nitride can be relieved. Note that the number of silicon single crystal substrates to be joined is not limited to two, and may be three or more. Below, a description will be given with reference to FIG. 1 with, as an example, a case in which the joined substrate is a substrate having two silicon single crystal substrates joined.

In the present invention, the silicon single crystal substrate 1 and the silicon single crystal substrate 2 are silicon single crystal substrates produced by a CZ method (hereinafter, also simply referred to as CZ single crystal substrates), and have a resistivity of 0.1 Ωcm or lower. The thickness of the joined substrate after the joining is made thicker than 2000 μm. When the CZ single crystal substrate has a resistivity of 0.1 Ωcm or lower, the silicon single crystal substrate is more rigid, so that the strength of the joined substrate increases. Therefore, it is possible to suppress warping of the substrate for an electronic device when the nitride semiconductor film is formed.

Furthermore, in the present invention, the oxygen concentration is preferably $3.0 \times 10^{17}$ to $1 \times 10^{18}$ atoms/cm$^3$ (ASTM'79). Generally, a CZ single crystal contains oxygen, unlike an FZ single crystal, and this enhances the strength and hardness of the substrate. Meanwhile, when the oxygen concentration is $3.0 \times 10^{17}$ to $1 \times 10^{18}$ atoms/cm$^3$ (ASTM'79), the occurrence of slips in the CZ single crystal substrate can be prevented.

In addition, an intermediate layer 4 may be formed between the silicon single crystal substrate 2 and the device layer 5. The intermediate layer 4 functions as a buffer layer inserted for improving the crystallinity of the device layer or controlling stress. Since the intermediate layer 4 can be fabricated with the same facility as the nitride semiconductor film, the intermediate layer 4 is preferably formed of a nitride.

A device layer 5 including a thin film of a nitride such as GaN, AlN, InN, AlGaN, InGaN, and AlInN, for example, is formed on the silicon single crystal substrate 2. Here, if an intermediate layer 4 is formed, the device layer 5 can be formed on the intermediate layer 4. The device layer 5 can be grown by vapor deposition, for example, by an MOVPE method or sputtering. The nitride thin film can be 1 to 20 μm, and can be designed in accordance with the device.

For example, the difference between gallium nitride and a Si (111) single crystal in lattice constant is 17%, and the difference in thermal expansion coefficient is 116%. Thus, stress is applied to the thin film and the substrate while growing gallium nitride at a high temperature. In addition, since the wafer is heated to 1000° C. or higher during the growth, brittle fracture does not occur in the wafer when subjected to stress, and the wafer exhibits ductility. Accordingly, dislocation occurs and the wafer undergoes plastic deformation.

The inventive substrate for an electronic device can prevent plastic deformation during growth and reduce warping by making the thickness of the substrate sufficiently thick and using CZ single crystal substrates having a resistivity of 0.1 Ωcm or lower. In view of warping of the substrate for an electronic device, the lower limit of the resistivity is not particularly limited, and can be appropriately determined. The lower limit can be greater than 0 Ωcm. Moreover, by making the thickness of the joined substrate more than 2000 μm, the strength of the joined substrate increases, so that the warping of the substrate for an electronic device due to the formed nitride semiconductor film can be suppressed further. Accordingly, in particular, the inventive substrate for an electronic device is optimum as a substrate for an electronic device used for a product with a high breakdown voltage. In view of the strength of the joined substrate, the upper limit of the thickness is not particularly limited, and can be appropriately determined. However, a thickness of 4800 μm is sufficient.

[Method for Producing Substrate for Electronic Device]

Furthermore, the present invention provides a method for producing a substrate for an electronic device by forming a nitride semiconductor film on a joined substrate including a silicon single crystal, the method including the steps of:

obtaining a joined substrate having a thickness of more than 2000 μm by joining a plurality of silicon single crystal substrates; and forming a nitride semiconductor film on the joined substrate by epitaxial growth, where the plurality of silicon single crystal substrates are produced by a CZ method and have a resistivity of 0.1 Ωcm or lower.

In the inventive production method, firstly, a plurality of silicon single crystal substrates are joined to obtain a joined substrate having a thickness of more than 2000 μm. Here, in the inventive production method, silicon single crystal substrates produced by a CZ method, which are hard and are excellent in strength and which have a resistivity of 0.1 Ωcm or lower are used as the plurality of silicon single crystal substrates.

In addition, the plurality of silicon single crystal substrates preferably have an oxygen concentration of $3.0 \times 10^{17}$ to $1 \times 10^{18}$ atoms/cm$^3$ (ASTM'79). When silicon single crystal substrates having an oxygen concentration of $3.0 \times 10^{17}$ to $1 \times 10^{18}$ atoms/cm$^3$ (ASTM'79) are used, slips in the CZ single crystal substrates can be prevented from occurring.

The method for joining the plurality of silicon single crystal substrates is not particularly limited, but the silicon single crystal substrates are preferably bonded with an oxide film. In addition, the oxide film before the joining can also be thinned, so that only the oxygen in the oxide film is diffused by a bonding heat treatment after the joining. Thus, it is possible to achieve a structure having no oxide film in the joining interface. By carrying out the adhesion of the silicon single crystal substrates in this manner by using an oxide film, the stress applied during the growth of the nitride can be relieved.

Furthermore, each of the plurality of silicon single crystal substrates preferably has a thickness of 1000 μm or more. To produce a joined substrate having a thickness of over 2000 μm, it is necessary to prepare a jig or the like such as apparatuses. However, by bonding two silicon single crystal substrates each having a thickness of 1000 μm or more, a joined substrate having a thickness exceeding 2000 μm can be produced easily.

Next, a nitride semiconductor film is epitaxially grown on the joined substrate produced in the above manner. Here, an intermediate layer can be formed before the growth of the nitride semiconductor film. By forming an intermediate layer when growing the nitride to insert an appropriate buffer layer, stress from the thin film due to the difference in thermal expansion coefficient and the difference in lattice constant can be controlled after cooling. In addition, by making the substrate thicker, plastic deformation during high-temperature growth can be prevented, and a wafer with an even smaller warp can be produced. To make the process simpler, it is desirable to fabricate the intermediate layer by using a nitride.

According to such a production method, a plurality of CZ silicon single crystal substrates having a resistivity of 0.1 Ωcm or lower are used, and furthermore, the joined substrate has a thickness of more than 2000 μm, so that a strong joined substrate can be fabricated. Therefore, it is possible to suppress warps in the substrate for an electronic device when the nitride semiconductor film is formed. Accordingly, in particular, the method is optimum as a method for producing a substrate for an electronic device used for a product with a high breakdown voltage.

EXAMPLE

Hereinafter, the present invention will be described more specifically with reference to an Example and Comparative Examples, but the present invention is not limited to the following Example.

Example 1

Two wafers (diameter: 150 mm, crystal orientation: (111)) of CZ silicon single crystal substrates each having a resistivity of 0.007 Ωcm, an oxygen concentration of $7 \times 10^{17}$ atoms/cm$^3$ (ASTM'79), and a thickness of 1100 μm were prepared.

Next, a substrate for an electronic device like the substrate shown in FIG. 1 (a) was fabricated in the following manner. A CZ silicon single crystal substrate (base wafer) 1 and a double-side-polished CZ silicon single crystal substrate (bond wafer) 2 were subjected to thermal oxidation, and a SiO$_2$ film having a thickness of 100 nm was formed on each substrate. Then, through a bonding process, a bonding heat treatment was performed at 1150° C. for 2 hours. Subsequently, for oxide film removal, the obtained substrate was immersed in 10% HF to remove a surface oxide film. Thus, the obtained joined substrate having a thickness of 2200 μm (two 1100-μm substrates+200-nm joining layer) was fabricated. Then, on the fabricated joined substrate, GaN with a thickness of 8 μm (intermediate layer: 4 μm, device layer: 4 μm) was epitaxially grown in an MOVPE furnace. The warp of the wafer after the epitaxial growth was 10 μm.

Comparative Example 1

In Comparative Example 1, a substrate was fabricated in the same manner as in Example 1 except that the thicknesses of the CZ silicon single crystal substrates were changed. Two wafers (diameter: 150 mm, crystal orientation: (111)) of CZ silicon single crystal substrates each having a thickness of 500 μm and two wafers (diameter: 150 mm, crystal orientation: (111)) each having a thickness of 625 μm were prepared, each wafer having a resistivity of 0.007 Ωcm and an oxygen concentration of $7 \times 10^{17}$ atoms/cm³ (ASTM'79).

CZ silicon single crystal substrates (base wafers) were subjected to thermal oxidation (thickness: 100 nm), and double-side-polished CZ silicon single crystal substrates (bond wafers) were subjected to thermal oxidation (thickness: 100 nm). Then, through a bonding process, a bonding heat treatment was performed at 1150° C. for 2 hours. Subsequently, for oxide film removal, the obtained substrates were immersed in 10% HF to remove a surface oxide film. Thus, the obtained bonded substrate having a thickness of 1000 μm (two 500-μm substrates+200-nm joining layer) and the obtained bonded substrate having a thickness of 1250 μm (two 625-μm substrates+200-nm joining layer) were fabricated. Then, on each of the bonded substrates, GaN with a thickness of 8 μm (intermediate layer: 4 μm, device layer: 4 μm) was epitaxially grown in the same MOVPE furnace. The warp of the wafer having a substrate thickness of 1250 μm was 20 μm. In the wafer having a substrate thickness of 1000 μm, the warp was 50 μm.

Comparative Example 2

In Comparative Example 2, a bonded substrate was fabricated by bonding an FZ silicon single crystal substrate and a CZ silicon single crystal substrate, and an epitaxial layer was grown on the fabricated bonded substrate. Wafers (diameter: 150 mm, crystal orientation: (111)) of CZ silicon single crystal substrates having a thickness of 625 μm and 675 μm respectively were prepared, each wafer having a resistivity of 0.007 Ωcm and an oxygen concentration of $7 \times 10^{17}$ atoms/cm³ (ASTM'79). In addition, wafers (diameter: 150 mm, crystal orientation: (111)) of FZ silicon single crystal substrates having a thickness of 625 μm and 675 μm respectively were prepared, each wafer having a resistivity of 5000 Ωcm and a nitrogen concentration of $8 \times 10^{14}$ atoms/cm³.

CZ silicon single crystal substrates (base wafers) were subjected to thermal oxidation (thickness: 100 nm), and double-side-polished FZ silicon single crystal substrates (bond wafers) were subjected to thermal oxidation (thickness: 100 nm). Then, through a bonding process, a bonding heat treatment was performed at 1150° C. for 2 hours. Subsequently, for oxide film removal, the obtained substrates were immersed in 10% HF to remove a surface oxide film. Thus, the obtained bonded substrate having a thickness of 1250 μm (two 625-μm substrates+200-nm joining layer) and the obtained bonded substrate having a thickness of 1350 μm (two 675-μm substrates+200-nm joining layer) were fabricated. Then, on each of the bonded substrates, GaN with a thickness of 8 μm (intermediate layer: 4 μm, device layer: 4 μm) was epitaxially grown in the same MOVPE furnace. The warp of the wafer having a substrate thickness of 1250 μm was 25 μm. In the wafer having a substrate thickness of 1350 μm, the warp was 15 μm.

Comparative Example 3

In Comparative Example 3, a bonded substrate was fabricated by bonding FZ silicon single crystal substrates, and an epitaxial layer was grown on the fabricated bonded substrate. Two wafers (diameter: 150 mm, crystal orientation: (111)) of FZ silicon single crystal substrates each having a thickness of 625 μm and two wafers (diameter: 150 mm, crystal orientation: (111)) of FZ silicon single crystal substrates each having a thickness of 675 μm were prepared, each wafer having a resistivity of 5000 Ωcm and a nitrogen concentration of $8 \times 10^{14}$ atoms/cm³.

FZ silicon single crystal substrates (base wafers) 1 were subjected to thermal oxidation (thickness: 100 nm), and double-side-polished FZ silicon single crystal substrates (bond wafers) 2 were subjected to thermal oxidation (thickness: 100 nm). Then, through a bonding process, a bonding heat treatment was performed at 1150° C. for 2 hours. Subsequently, for oxide film removal, the obtained substrates were immersed in 10% HF to remove a surface oxide film. Thus, the obtained bonded substrate having a thickness of 1250 μm (two 625-μm substrates+200-nm joining layer) and the obtained bonded substrate having a thickness of 1350 μm (two 675-μm substrates+200-nm joining layer) were fabricated. Then, on each of the bonded substrates, GaN with a thickness of 8 μm (intermediate layer: 4 μm, device layer: 4 μm) was epitaxially grown in the same MOVPE furnace. The warp of the wafer having a substrate thickness of 1250 μm was 30 μm. In the wafer having a substrate thickness of 1350 μm, the warp was 20 μm.

Comparative Example 4

In Comparative Example 4, the thicknesses of the CZ silicon single crystal substrates were made even thinner than in Comparative Example 1, and substrates were fabricated in the same manner as in Comparative Example 1. Wafers (diameter: 150 mm, crystal orientation: (111)) of CZ silicon substrates having a substrate thickness of 400 μm and 400 μm respectively were prepared, each wafer having a resistivity of 0.007 Ωcm or lower and an oxygen concentration of $7 \times 10^{17}$ atoms/cm³ (ASTM'79).

A CZ silicon single crystal substrate (base wafer) 1 was subjected to thermal oxidation (thickness: 50 nm), and a double-side-polished CZ silicon single crystal substrate (bond wafer) 2 was subjected to thermal oxidation (thickness: 50 nm). Then, through a bonding process, a bonding heat treatment was performed at 1150° C. for 2 hours. Subsequently, for oxide film removal, the obtained substrate was immersed in 10% HF to remove a surface oxide film. Thus, the obtained bonded substrate having a thickness of 800 μm (two 400-μm substrates+100-nm joining layer) was fabricated. Then, on the substrate, GaN with a thickness of 8 μm (intermediate layer: 4 μm, device layer: 4 μm) was epitaxially grown in an MOVPE furnace. The warp of the wafer was 200 μm.

Comparative Example 5

In Comparative Example 5, an epitaxial layer was grown without bonding CZ silicon single crystal substrates. A wafer (diameter: 150 mm, crystal orientation: (111)) of a CZ silicon substrate having a resistivity of 0.007 Ωcm or lower, an oxygen concentration of $7 \times 10^{17}$ atoms/cm³ (ASTM'79), and a substrate thickness of 625 μm was prepared.

Then, on the substrate, GaN with a thickness of 8 μm (intermediate layer: 4 μm, device layer: 4 μm) was epitaxially grown in an MOVPE furnace. The warp of the wafer was 300 μm.

From the above results, when CZ silicon single crystal substrates having a resistivity of 0.1 Ωcm or lower were bonded and the thickness of the joined substrate after the bonding was made thicker than 2000 μm as in Example 1, the wafer had the smallest warp when a nitride semiconductor film was formed. On the other hand, it was revealed that the wafers had a greater warp in the cases where the thickness of the substrate was 2000 μm or less, even when CZ silicon single crystal substrates having a similar resistivity were used as in Comparative Examples 1, 4, and 5. In addition, from the comparison of Comparative Example 1 and Comparative Examples 2 and 3, it was revealed that the warp of the wafer becomes even greater if an FZ silicon single crystal substrate, which is softer than a CZ silicon single crystal substrate, is used, even when the substrates have the same thickness.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A substrate for an electronic device, comprising a nitride semiconductor film formed on a joined substrate comprising a silicon single crystal, wherein
the joined substrate has a plurality of silicon single crystal substrates that are joined and has a thickness of more than 2000 μm, and
the plurality of silicon single crystal substrates are produced by a CZ method and have a resistivity of 0.1 Ωcm or lower.

2. The substrate for an electronic device according to claim 1, wherein the plurality of silicon single crystal substrates have an oxygen concentration of $3.0 \times 10^{17}$ to $1 \times 10^{18}$ atoms/cm$^3$ (ASTM'79).

3. The substrate for an electronic device according to claim 2, wherein the joined substrate has a plurality of CZ silicon single crystal substrates joined via a SiO$_2$ film.

4. The substrate for an electronic device according to claim 1, wherein the joined substrate has a plurality of CZ silicon single crystal substrates joined via a SiO$_2$ film.

5. A method for producing a substrate for an electronic device by forming a nitride semiconductor film on a joined substrate comprising a silicon single crystal, the method comprising the steps of:
obtaining a joined substrate having a thickness of more than 2000 μm by joining a plurality of silicon single crystal substrates; and
forming a nitride semiconductor film on the joined substrate by epitaxial growth, wherein
the plurality of silicon single crystal substrates are produced by a CZ method and have a resistivity of 0.1 Ωcm or lower.

6. The method for producing a substrate for an electronic device according to claim 5, wherein the plurality of silicon single crystal substrates have an oxygen concentration of $3.0 \times 10^{17}$ to $1 \times 10^{18}$ atoms/cm$^3$ (ASTM'79).

7. The method for producing a substrate for an electronic device according to claim 6, wherein a plurality of CZ silicon single crystal substrates are joined via a SiO$_2$ film in the step of obtaining a joined substrate.

8. The method for producing a substrate for an electronic device according to claim 5, wherein a plurality of CZ silicon single crystal substrates are joined via a SiO$_2$ film in the step of obtaining a joined substrate.

* * * * *